US010170874B1

(12) United States Patent
Costello

(10) Patent No.: US 10,170,874 B1
(45) Date of Patent: Jan. 1, 2019

(54) CABLE ASSEMBLY HAVING A SUBSTRATE WITH MULTIPLE PASSIVE FILTERING DEVICES BETWEEN TWO SECTIONS OF THE CABLE ASSEMBLY

(71) Applicant: TE CONNECTIVITY CORPORATION, Berwyn, PA (US)

(72) Inventor: Brian Patrick Costello, Scotts Valley, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/704,096

(22) Filed: Sep. 14, 2017

(51) Int. Cl.
| | |
|---|---|
| H01R 13/66 | (2006.01) |
| H01R 13/7195 | (2011.01) |
| H01R 12/70 | (2011.01) |
| H05K 1/18 | (2006.01) |
| H05K 1/11 | (2006.01) |
| H01R 13/514 | (2006.01) |
| H01R 13/405 | (2006.01) |
| H01R 13/504 | (2006.01) |

(52) U.S. Cl.
CPC ..... *H01R 13/7195* (2013.01); *H01R 13/6625* (2013.01); *H01R 13/6658* (2013.01); *H01R 23/667* (2013.01); *H05K 1/11* (2013.01); *H05K 1/18* (2013.01); *H01R 13/405* (2013.01); *H01R 13/504* (2013.01); *H01R 13/514* (2013.01)

(58) Field of Classification Search
CPC ........... H01R 13/66; H01R 13/6625; H01R 13/6658; H01R 13/7195; H01R 23/667; H05K 1/11; H05K 1/18

USPC .............. 439/92, 620.01, 620.09, 620.2
See application file for complete search history.

(56) References Cited

U.S. PATENT DOCUMENTS

| | | |
|---|---|---|
| 5,119,020 A | 6/1992 | Massey et al. |
| 5,236,376 A | 8/1993 | Cohen |
| 5,766,027 A | 6/1998 | Fogg |
| 6,168,469 B1 | 1/2001 | Lu |
| 6,467,165 B1 | 10/2002 | Glynn |
| 6,617,939 B1 | 9/2003 | Vermeersch |
| 6,837,747 B1 | 1/2005 | Kosmala |
| 6,867,362 B2 | 3/2005 | Cherniski et al. |
| 7,113,002 B2 | 9/2006 | Otsuka et al. |
| 7,285,018 B2 | 10/2007 | Kenny et al. |
| 7,540,781 B2 | 6/2009 | Kenny et al. |
| 7,670,147 B1 * | 3/2010 | Lee ............. H01R 13/6625 439/620.09 |
| 7,887,371 B2 | 2/2011 | Kenny et al. |

(Continued)

*Primary Examiner* — Chandrika Prasad

(57) ABSTRACT

A cable assembly includes multiple electrical cables and a filtering module. The electrical cables are arranged in a first cable section and a second cable section. Each electrical cable has a pair of signal conductors. The filtering module includes a substrate and multiple passive filtering devices mounted on the substrate. The filtering module is disposed between the first cable section and the second cable section along a length of the cable assembly and is mechanically connected to ends of the first and second cable sections. The passive filtering devices are electrically connected to the signal conductors of the electrical cables. The cable assembly is configured to be electrically connected between first and second connectors. The filtering module is configured to filter electrical signals conveyed along the electrical cables between the first and second connectors.

20 Claims, 6 Drawing Sheets

(56) References Cited

U.S. PATENT DOCUMENTS

| | | |
|---|---|---|
| 8,123,563 B2 | 2/2012 | Kenny et al. |
| 8,192,232 B2 * | 6/2012 | Whiteman, Jr. ... H01R 13/7195 |
| | | 439/620.01 |
| 9,608,590 B2 | 3/2017 | Hamner et al. |
| 2005/0112920 A1 * | 5/2005 | Venaleck ............... H01R 9/032 |
| | | 439/92 |

* cited by examiner

CABLE ASSEMBLY HAVING A SUBSTRATE WITH MULTIPLE PASSIVE FILTERING DEVICES BETWEEN TWO SECTIONS OF THE CABLE ASSEMBLY

BACKGROUND OF THE INVENTION

The subject matter herein relates generally to connector systems that include cable assemblies extending between and providing signal transmission paths between two electrical connectors.

In high speed electrical signaling systems, electrical signals are transmitted between two electronic boards or devices, such as between a daughter card and a motherboard within a computer. The electrical signals may be transmitted along a cable assembly between the two electronic boards. At high signal transfer speeds, such as above 10 Gb/s, electrical interference or noise along the signal lines is a concern because such noise can degrade the quality of the transmitted signals. Some electrical signaling systems include passive filtering devices located on the electronic boards, such as mounted to a daughter card. The passive filtering devices on the electronic boards are used to filter out certain frequencies to reduce noise and improve the signal quality at high speeds.

The electronic boards in high speed signaling systems can be fairly complex and dense with a significant number of signal counts and other components mounted along the electronic boards. There may be little or no available space on the electronic boards for passive filtering components, such as passive filtering devices. As a result, an electronic board manufacturer may have to omit passive filtering components from the signaling system, risking signal degradation, or else include the passive filtering components at the omission of other desired components for the board.

A need remains for a high speed connector system that provides passive filtering components for improved signal integrity without adding to the complexity and density of the electronic boards in a signaling system.

BRIEF DESCRIPTION OF THE INVENTION

In one or more embodiments of the present disclosure, a cable assembly is provided that includes multiple electrical cables and a filtering module. The electrical cables are arranged in a first cable section and a second cable section. Each electrical cable has a pair of signal conductors configured to convey differential signals. Each of the first cable section and the second cable section has a connector end and a device end. The filtering module includes a substrate and multiple passive filtering devices mounted on the substrate. The filtering module is disposed between the first cable section and the second cable section along a length of the cable assembly and is mechanically connected to the respective device ends of the first and second cable sections. The passive filtering devices are electrically connected to the signal conductors of the electrical cables. The connector ends of the first and second cable sections are configured to be electrically connected to corresponding first and second connectors. The filtering module is configured to filter electrical signals conveyed along the electrical cables between the first and second connectors.

In one or more embodiments of the present disclosure, a connector system is provided that includes first and second electrical connectors and multiple cable assemblies. Each of the first and second electrical connectors has a mating end and a mounting end. The cable assemblies are electrically connected to and extend between the respective mounting ends of the first and second electrical connectors. The cable assemblies are arranged in a stack. Each of the cable assemblies includes a filtering module, a first cable section of one or more electrical cables, and a second cable section of one or more electrical cables. The filtering module includes a substrate and multiple passive filtering devices mounted on the substrate. The first cable section has a connector end coupled to the mounting end of the first electrical connector and a device end coupled to the filtering module. The second cable section has a connector end coupled to the mounting end of the second electrical connector and a device end coupled to the filtering module. The filtering module of each cable assembly is configured to filter electrical signals conveyed along the electrical cables of the first and second cable sections between the first and second connectors.

In one or more embodiments of the present disclosure, a cable assembly is provided that includes a first electrical cable, a second electrical cable, and a filtering module. Each of the first and second electrical cables has multiple signal conductors. The filtering module is disposed between the first electrical cable and the second electrical cable. The filtering module includes a circuit board and multiple passive filtering devices. At least some of the passive filtering devices are terminated to device contact pads on a first side of the circuit board. The circuit board extends between a first cable end and a second cable end that is opposite to the first cable end. The circuit board includes a first array of signal contact pads located between the passive filtering devices and the first cable end along the one or both sides. The circuit board includes a second array of signal contact pads located between the passive filtering devices and the second cable end along the first side. The circuit board includes conductive circuit elements that provide conductive signal paths between the signal contact pads and the device contact pads to which the passive filtering devices are terminated. The signal conductors of the first electrical cable are terminated to the signal contact pads in the first array, and the signal conductors of the second electrical cable are terminated to the signal contact pads in the second array. The passive filtering devices of the filtering module are configured to filter electrical signals conveyed along the signal conductors of the first and second electrical cables.

DETAILED DESCRIPTION OF THE INVENTION

Embodiments of the present disclosure provide a connector system with at least one cable assembly that extends between and electrically connects two connectors of the connector system. Each cable assembly includes a filtering module along the signal path between the two connectors. The filtering module includes passive filtering devices that provide passive filtering of the signals transmitted along the cable assembly between the two connectors. For example, the passive filtering devices may be configured to allow high frequency signals to be transmitted across the filtering module while filtering out low frequency electrical energy associated with noise or interference. Thus, the passive filtering devices may improve signal integrity. The electrical connectors of the connector system are configured to mate to electronic boards of a signaling system, such as daughter cards, motherboards, or the like. By installing the passive filtering devices along the path of the cables between the two connectors, the electronic boards may omit similar passive filtering devices to free additional available space on the boards without compromising the signal integrity. The available space can be used for adding components, increasing the signal count, or reducing the complexity and signal density of the boards.

Figure 1:
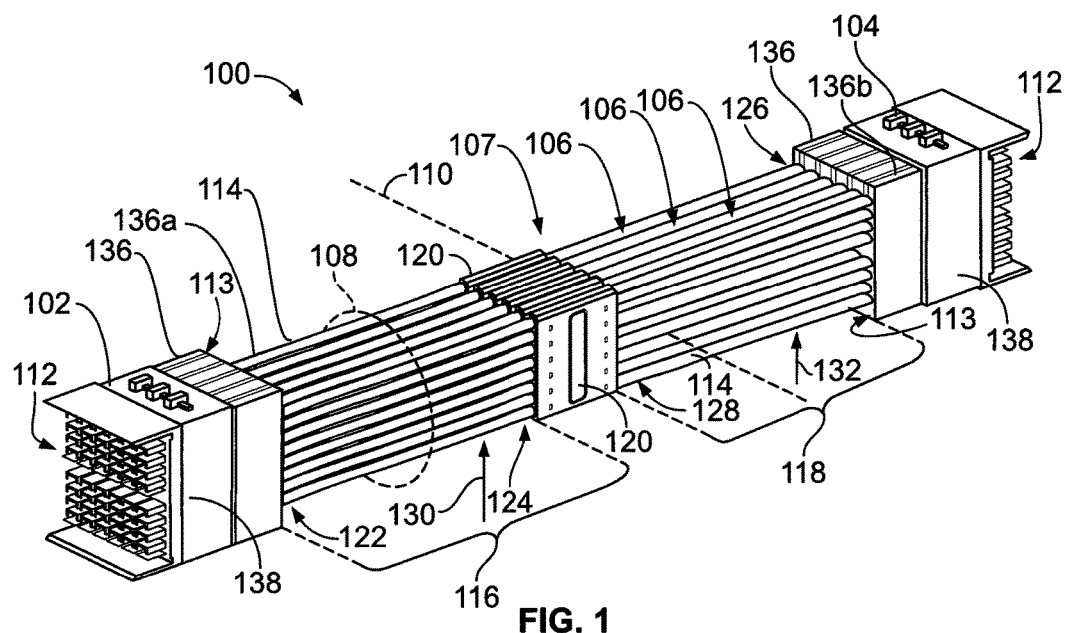
FIG. 1 is a perspective view of a connector system formed in accordance with an embodiment.

FIG. 1 is a perspective view of a connector system 100 formed in accordance with an embodiment. The connector system 100 includes a first electrical connector 102, a second electrical connector 104, and multiple cable assemblies 106 that extend between and electrically connect the first and second electrical connectors 102, 104. The cable assemblies 106 are collectively referred to as a cable harness 108. The cable assemblies 106 in the cable harness 108 are arranged in a stack 107 along a stack axis 110. In the illustrated embodiment, the cable harness 108 includes six cable assemblies 106, but the cable harness 108 may include fewer than six or more than six cable assemblies 106 in other embodiments. For example, the connector system 100 may have as few as one cable assembly 106 between the two connectors 102, 104. The cable assemblies 106 are each configured to provide conductive signal paths that connect the two connectors 102, 104.

The first and second connectors 102, 104 each have a mating end 112 and a mounting end 113. The mounting ends 113 are electrically terminated to the cable assemblies 106. In the illustrated embodiment, the connectors 102, 104 are both in-line or linear connectors such that the mating end 112 of each connector 102, 104 is opposite to the respective mounting end 113 (and is oriented parallel thereto). Alternatively, one or both of the connectors 102, 104 may be right angle connectors instead of in-line connectors such that the mating and mounting ends 112, 113 of the respective connector 102, 104 are oriented transverse (e.g., perpendicular) to one another. The connectors 102, 104 in the illustrated embodiment are backplane-style header connectors configured to mate to corresponding receptacle mating connectors. The mating connectors may be mounted to different electronic boards, such as daughter cards, motherboards, or the like, of a computer or another electrical system. For example, the connector system 100 may be installed in a computer or another electrical system by mating the first connector 102 to a mating connector on one electronic board and mating the second connector 104 to a mating connector on another electronic board to enable electrical signal (and optionally power) transfer between the electronic boards through the connector system 100 and the corresponding mating connectors. Although the connectors 102, 104 in the illustrated embodiment are both shown as header connectors, at least one of the connectors 102, 104 may be a receptacle connector in an alternative embodiment.

Each of the cable assemblies 106 includes multiple electrical cables 114. The electrical cables 114 are arranged in a first cable section 116 and a second cable section 118. The first cable section 116 has a connector end 122 and a device end 124. The second cable section 118 also has a connector end 126 and a device end 128. Each cable assembly 106 also includes a filtering module 120 along the length of the cable assembly 106. The filtering module 120 is disposed between the first cable section 116 and the second cable section 118. The filtering module 120 is mechanically connected to the device end 124 of the first cable section 116 and the device end 128 of the second cable section 118. The connector end 122 of the first cable section 116 is mechanically and electrically connected to the mounting end 113 of the first connector 102. The connector end 126 of the second cable section 118 is mechanically and electrically connected to the mounting end 113 of the second connector 104. All of the cable assemblies 106 are similarly arranged between the two connectors 102, 104. Thus, the connector system 100 extends a length that includes, in series, the first connector 102, the first cable sections 116 of the one or more cable assemblies 106, the filtering modules 120, the second cable sections 118, and the second connector 104.

The first cable section 116 of each cable assembly 106 includes at least one electrical cable 114, and the second cable section 118 also includes at least one electrical cable 114. In the illustrated embodiment, the first and second cable sections 116, 118 each include eight individual cables 114, but the cable sections 116, 118 may each have as few as one cable 114 or more than eight cables 114 in other embodiments. Therefore, although the following description refers to each of the cable sections 116, 118 as having multiple cables 114, it is understood that the cable sections 116, 118 may each have only a single cable 114 in an alternative embodiment. The cables 114 in the first cable section 116 are indirectly electrically connected to the cables 114 in the second cable section 118 of the same cable assembly 106 via the filtering module 120. For example, the device end 124 of the first cable section 116 is electrically connected (or terminated) to the filtering module 120, but is not directly electrically connected to the device end 128 of the second cable section 118, and vice-versa.

The filtering modules 120 are configured to filter electrical energy (e.g., current) that is conveyed along the electrical cables 114 between the connectors 102, 104. For example, the filtering modules 120 include passive filtering devices 140 (shown in FIG. 3) that are configured to filter out certain frequencies of electrical energy to reduce electrical interference or noise along the signal path provided by the connector system 100. The filtering modules 120 may be coupling modules (e.g., capacitive coupling modules) that provide in-line alternating current (AC) coupling along the cable assemblies 106 at locations that are spaced apart from the first and second connectors 102, 104, the mating connectors (not shown), and the electronic boards or devices (not shown) on which the mating connectors are mounted. By providing the filtering modules 120 along the length of the cable assemblies 106, signal integrity may be improved at high signal speeds without requiring any real estate on the electronic boards because the passive filtering components are remote from the electronic boards.

The cables 114 in the first cable section 116 of each cable assembly 106 may be aligned in a row (or column) 130. The cables 114 in the second cable section 116 of each cable assembly 106 may also be aligned in a row 132. The rows 130, 132 extend parallel to each other. The rows 130, 132 are transverse to the stack axis 110, and may be perpendicular to the stack axis 110.

In an embodiment, the connectors 102, 104 each include multiple contact modules 136 stacked together within a connector housing 138. Each cable assembly 106 extends between and electrically connects a corresponding one of the contact modules 136a of the first connector 102 to a corresponding one of the contact modules 136b of the second connector 104. The electrical cables 114 at the connector end 122 of the first cable section 116 are electrically terminated to the associated contact module 136a of the first connector 102, and the electrical cables 114 at the connector end 126 of the second cable section 118 are electrically terminated to the associated contact module 136b of the second connector 104. The connectors 102, 104 each have six contact modules 136 in the illustrated embodiment, corresponding to the six cable assemblies 106.

Figure 2:
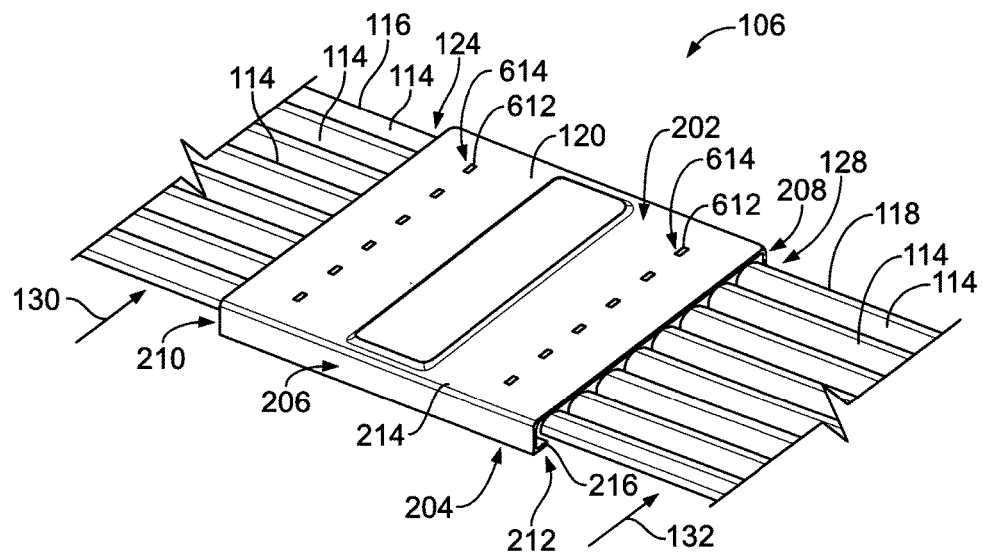
FIG. 2 is a perspective view of a portion of one cable assembly of the connector system according to an embodiment.

FIG. 2 is a perspective view of a portion of one cable assembly 106 of the connector system 100 (shown in FIG. 1) according to an embodiment. The portion of the cable assembly 106 shown in FIG. 2 includes the filtering module 120 and abbreviated lengths of the first and second cable sections 116, 118 on either side of the filtering module 120. Although only one cable assembly 106 is shown in FIG. 2, the illustrated cable assembly 106 may be representative of other cable assemblies 106 in the connector system 100.

The filtering module 120 has a top 202, a bottom 204, a front 206, a back 208, a first cable end 210, and a second cable end 212 opposite the first cable end 210. As used herein, relative or spatial terms such as "front," "rear," "top," "bottom," "first," and "second," are only used to distinguish the referenced elements of the connector system 100 and the cable assembly 106, and do not require particular positions or orientations relative to gravity and/or relative to the surrounding environment of the connector system 100 or the cable assembly 106. The filtering module 120 may be generally planar. The top 202 and bottom 204 of the filtering module 120 are broader (e.g., have greater surface areas) than the narrower front 206, back 208, and cable ends 210, 212. The electrical cables 114 in the first and second cable sections 116, 118 are aligned in the respective rows 130, 132. The rows 130, 132 are coplanar with the filtering module 120. The device end 124 of the first cable section 116 extends from the first cable end 210 of the filtering module 120, and the device end 128 of the second cable section 118 extends from the second cable end 212 of the filtering module 120.

The filtering module 120 includes a cover 214 that extends along and defines the top 202, front 206, and back 208 of the filtering module 120. The cover 214 may be electrically conductive. For example, the cover 214 may be formed of a sheet of metal. The cover 214 extends over end segments of the electrical cables 114 along the device ends 124, 128. The conductive cover 214 can provide electrical shielding for the cables 114 and other electrical components within the cover 214, and may also be used to provide an electrical ground path.

The filtering module 120 also includes a dielectric filler material 216. In the illustrated embodiment, the dielectric filler material 216 defines the bottom 204 of the filtering module 120. In an alternative embodiment, the cover 214 itself, or a panel that couples to the cover 214, may extend along and define the bottom 204 of the filtering module 120. The dielectric filler material 216 is an electrically insulating material. The dielectric filler material 216 may be applied by flowing the material in a heated liquid state along the bottom of the filtering module 120 and along the end segments of the electrical cables 114, then allowing the material to cool and solidify. As shown in FIG. 2, the dielectric filler material 216 at least partially surrounds the electrical cables 114 within the cover 214 at the second cable end 212. The dielectric filler material 216 may provide various benefits for the filtering module 120, such as a seal that blocks entrance of debris and other contaminants into the filtering module 120, structural support for the cable assembly 106, strain relief for the electrical cables 114, and the like.

Figure 3:
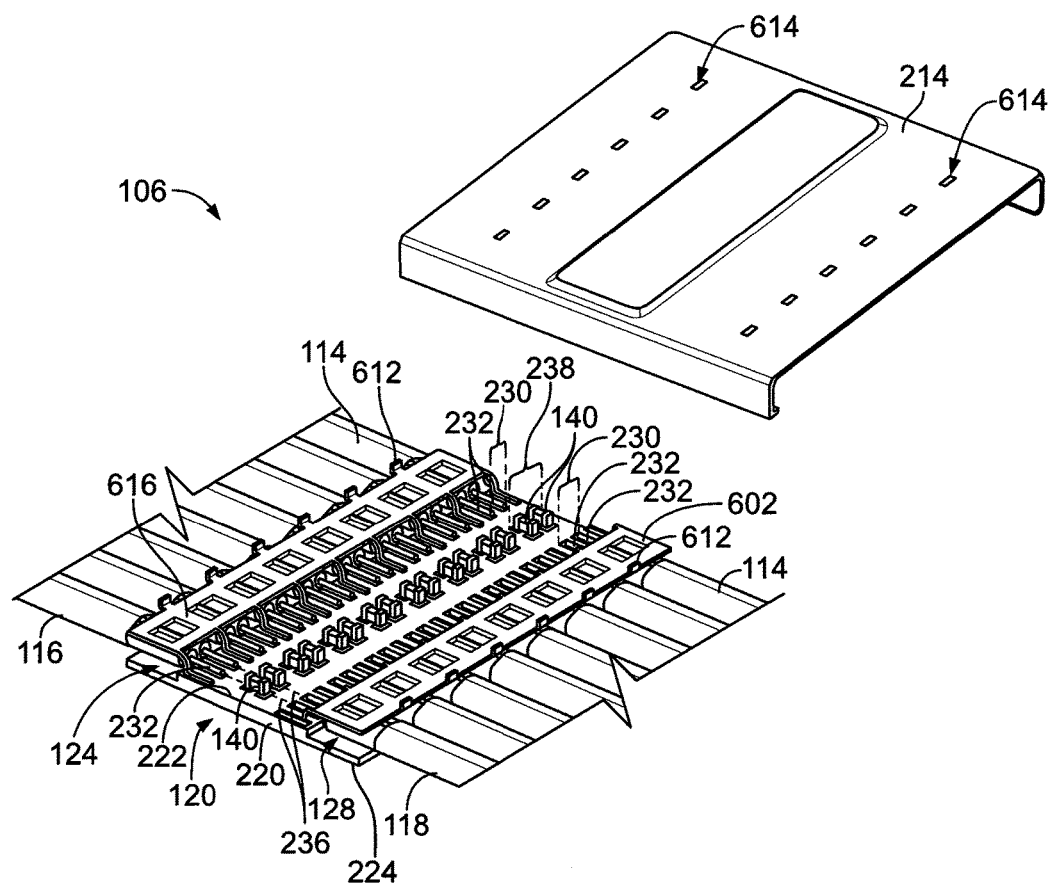
FIG. 3 is an exploded perspective view of the cable assembly shown in FIG. 2 according to an embodiment.

FIG. 3 is an exploded perspective view of the cable assembly 106 shown in FIG. 2 according to an embodiment. The cover 214 of the filtering module 120 is shown uncoupled from the filtering module 120, and the dielectric filler material 216 (shown in FIG. 2) is absent. The filtering module 120 includes a substrate 220 having a first side 222 and a second side 224 that is opposite the first side 222. The first side 222 is a top side in the illustrated orientation and is referred to herein as a top side 222, but may be a bottom side, a left side, a front side, etc. in other orientations of the cable assembly 106. Similarly, the second side 224 is referred to as a bottom side 224 herein.

The filtering module 120 includes multiple passive filtering devices 140 mounted on the top side 222 of the substrate 220. The electrical cables 114 are also mounted to the top side 222 of the substrate 220. In an alternative embodiment, some passive filtering devices 140 may also be mounted on the bottom side 224 of the substrate 220, such that the passive filtering devices 140 are mounted along both sides 222, 224. In such alternative embodiment, the lateral width of the substrate 220 (e.g., perpendicular to the lengths of the cables 114) may be reduced relative to mounting all of the passive filtering devices 140 on a common side 222. In one or more alternative embodiments, at least some of the electrical cables 114 may be mounted along an opposite side 222, 224 of the substrate 220 as the passive filtering devices 140. For example, the passive filtering devices 140 may be mounted along the top side 222, and the cables 114 may be mounted along the bottom side 224. The substrate 220 in the illustrated embodiment is a board, but the substrate 220 may be any type of structural body in other embodiments, such as a glass or plastic sheet or an overmolded portion of a lead frame. The substrate 220 may be formed of a dielectric material to provide electrical insulation between adjacent electrical cables 114 and adjacent passive filtering devices 140.

The electrical cables 114 each have at least one pair 230 of signal conductors 232. In the illustrated embodiment, the electrical cables 114 are twin-axial cables that have a single pair 230 of signal conductors 232. The signal conductors 232 in each pair 230 are electrically insulated from each other by one or more dielectric layers (not shown) of the cable 114. The signal conductors 232 in each pair 230 are configured to convey differential signals, such that the pairs 230 may be differential pairs. In the illustrated embodiment, eight twin-axial cables 114 are aligned in each of the first and second cable sections 116, 118, providing sixteen total differential signal pairs 230 (and thirty-two total signal conductors 232) that are electrically terminated to the filtering module 120. As used herein, "electrically terminated" refers to both mechanical attachment and electrical connection between two conductive elements. As described above, the cable sections 116, 118 may have other numbers of cables 114 and signal conductors 232 in other embodiments. In one or more alternative embodiments, the electrical cables 114 may be other than twin-axial cables, such as individual insulated wires, co-axial cables, or ribbon cables.

The substrate 220 includes conductive elements (not shown), such as traces or leads, embedded on or within the substrate 220 that provide signal lines 236 that connect the signal conductors 232 of the cables 114 in the first cable section 116 to the signal conductors 232 of the cables 114 in the second cable section 118. Each signal line 236 extends between and electrically connects one of the terminated signal conductors 232 from the first cable section 116 and a corresponding one of the terminated signal conductors 232 from the second cable section 118. Electrical signals can be conveyed across the filtering module 120 from the signal conductors 232 in the first cable section 116 through the conductive elements in the substrate 220 that define the signal lines 236 and into the signal conductors 232 in the second cable section 118 (and vice-versa).

The passive filtering devices 140 on the filtering module 120 are electrically connected to the signal conductors 232 of the cables 114. In an embodiment, each passive filtering device 140 is located along a different one of the conductive signal lines 236. The passive filtering devices 140 are mounted to the substrate 220 between the signal conductors 232 of the first cable section 116 and the signal conductors 232 of the second cable section 118. The passive filtering devices 140 in the signal lines 236 receive the electrical signals transmitted across the filtering module 120. In an embodiment, the passive filtering devices 140 are arranged in pairs 238. Each pair 238 of passive filtering devices 140 is in-line between two corresponding pairs 230 of signal conductors 232 (e.g., between one pair 230 of the first cable section 116 and one pair 230 of the second cable section 118).

The passive filtering devices 140 are configured to filter electrical signals (e.g., electrical current) conveyed along the signal conductors 232. The passive filtering devices 140 are tuned to allow frequencies in a frequency range of interest to be conveyed between the first cable section 116 and the second cable section 118. The passive filtering devices 140 are configured to filter out frequencies outside of the frequency range of interest, which may be attributable to noise or interference. For example, the passive filtering devices 140 may be configured to allow high frequency signals in the range of interest to be conveyed across the filtering module 120, while filtering out electrical signals at frequencies lower than the high frequency signals in the range of interest. The passive filtering devices 140 do not require a source of power to filter the electrical signals. Each of the passive filtering devices 140 may include one or more capacitors, resistors, and/or inductors. All of the passive filtering devices 140 may be identical to each other or at least some of the passive filtering devices 140 may be different from other passive filtering devices 140. In one non-limiting embodiment, all of the passive filtering devices 140 are capacitors.

When the cover 214 is mounted to the filtering module 120, the cover 214 extends above the top side 222 of the substrate 220. Both the passive filtering devices 140 and the device ends 124, 128 of the first and second cable sections 116, 118 are disposed between the substrate 220 and the cover 214.

Figure 4:
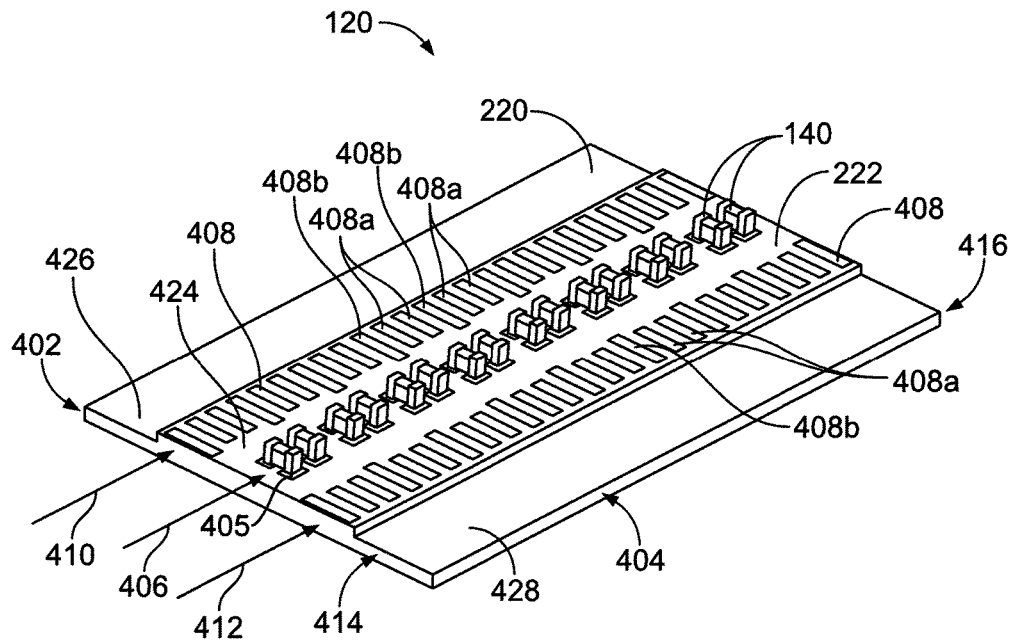
FIG. 4 is a top perspective view of a substrate and passive filtering devices of a filtering module of the cable assembly according to an embodiment.
Figure 5:
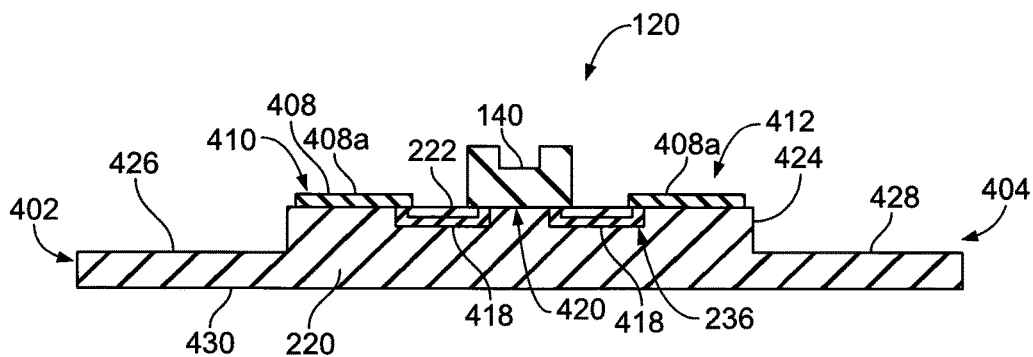
FIG. 5 is a cross-sectional view of the substrate and one of the passive filtering devices of the filtering module according to an embodiment.

FIG. 4 is a top perspective view of the substrate 220 and the passive filtering devices 140 of the filtering module 120 according to an embodiment. FIG. 5 is a cross-sectional view of the substrate 220 and one of the passive filtering devices 140 of the filtering module 120 according to an embodiment. In the illustrated embodiment, the substrate 220 is a circuit board, and is referred to herein as circuit board 220. The top side 222 of the circuit board 220 extends between a first cable end 402 and a second cable end 404 that is opposite to the first cable end 402. The circuit board 220 also has a front end 414 and a back end 416 that is opposite to the front end 414. The front and back ends 414, 416 each extend between the first and second cable ends 402, 404. The passive filtering devices 140 are mounted to the top side 222 of the circuit board 220 between the first and second cable ends 402, 404. The passive filtering devices 140 are each terminated to corresponding device contact pads 405 disposed along the top side 222 of the circuit board 220. The passive filtering devices 140 may be surface-mounted to the corresponding device contact pads 405 through soldering or the like, but the passive filtering devices 140 may be through-hole mounted to the circuit board 220 in an alternative embodiment. The passive filtering devices 140 are arranged in a single file line 406 in the illustrated embodiment. The line 406 extends from the front end 414 to the back end 416. In other embodiments, the passive filtering devices 140 may be arranged differently along the top side 222. For example, the passive filtering devices 140 in one alternative embodiment may be staggered in two lines.

The circuit board 220 includes contact pads 408 along the top side 222. As shown in FIG. 4, the contact pads 408 are arranged in a first array 410 and a second array 412. The first and second arrays 410, 412 are linear rows in the illustrated embodiment that extend parallel to each other, and are referred to herein as rows 410, 412. The passive filtering devices 140 are between the two rows 410, 412 of contact pads 408. In the illustrated embodiment, the line 406 of passive filtering devices 140 extends parallel to the rows 410, 412. In alternative embodiments, the first and second arrays 410, 412 may be other than linear rows, such as staggered sets of contact pads 408 at different distances from the cable ends 402, 404.

In an embodiment, the contact pads 408 include signal pads 408a and ground pads 408b. Each of the rows 410, 412 includes both signal pads 408a and ground pads 408b arranged such that the signal pads 408a are in pairs and a ground pad 408b extends between adjacent pairs of signal pads 408a. The signal and ground pads 408a, 408b may be distributed in a different pattern in other embodiments. The signal pads 408a are configured to be electrically terminated to the signal conductors 232 (shown in FIG. 3) of the electrical cables 114 (FIG. 3) via soldering using a surface-mount technology. The signal pads 408a define a connection interface between the electrical cables 114 and the filtering module 120 (FIG. 3). The ground pads 408b are configured to be electrically terminated to grounding or shield elements (such as the ground bus bar 602 shown in FIG. 7) via soldering. In an alternative embodiment, instead of contact pads 408, the circuit board 220 may include conductive vias or through-holes for through-hole mounting the signal conductors 232 of the electrical cables 114 (and the legs of the grounding shield) to the filtering module 120.

The contact pads 408 in the two rows 410, 412 are spaced apart from the passive filtering devices 140 along the top side 222 of the circuit board 220. As shown in FIG. 5, the circuit board 220 includes conductive circuit elements 418 embedded at least partially within the circuit board 220 (e.g., below the top side 222). The conductive circuit elements 418 are configured to provide conductive signal paths between the signal contact pads 408a and the device contact pads 405 to which the passive filtering devices 140 are terminated. The circuit elements 418 may be metal traces, leads, wires, or the like. The circuit elements 418 define the signal lines 236 that extend between the signal contact pads 408a in the first row 410 and the signal contact pads 408a in the second row 412. The circuit elements 418 directly electrically connect the signal contact pads 408a to the associated passive filtering devices 140, but do not directly electrically connect two signal contact pads 408a to each other. For example, as shown in FIG. 5, each signal line 236 is defined by two circuit elements 418 that are spaced apart by a gap 420 and electrically insulated from one another. Each passive filtering device 140 is configured to provide AC capacitive coupling between the signal conductors 232 (shown in FIG. 3) that are electrically terminated to the signal contact pads 408a on both sides of the passive filtering device 140.

In the illustrated embodiment, the circuit board 220 includes a raised platform 424 located between two recessed areas 426, 428. The platform 424 and the two recessed areas 426, 428 extend the length of the circuit board 220 between the front end 414 and the back end 416. One of the recessed areas 426 extends from the first cable end 402 to the platform 424, and the other recessed area 428 extends from the platform 424 to the second cable end 404. The contact pads 408 and the passive filtering devices 140 are mounted to the platform 424. The circuit board 220 has a height defined between the top side 222 and an opposite bottom side 430. The height of the circuit board 220 is greater along the raised platform 424 than along the recessed areas 426, 428. The recessed areas 426, 428 are configured to accommodate jacket-removed segments 504 (shown in FIG. 6) of the electrical cables 114 (FIG. 6).

FIGS. 6-9 show one of the cable assemblies 106 of the connector system 100 (shown in FIG. 1) in various stages of assembly according to an embodiment.

Figure 6:
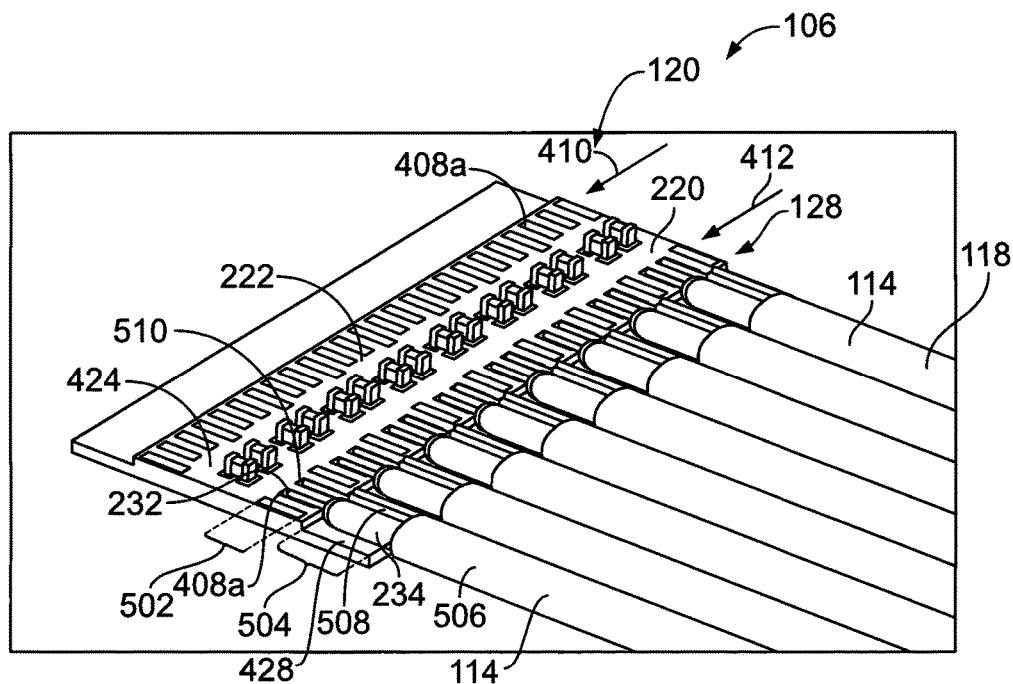
FIG. 6 is a top perspective view of the cable assembly during an early assembly stage showing the substrate of the filtering module and a length of electrical cables.

FIG. 6 is a top perspective view of the cable assembly 106 during an early assembly stage showing the circuit board 220 of the filtering module 120 and a length of the electrical cables 114 in the second cable section 118. In order to electrically terminate the cables 114 to the filtering module 120, the signal conductors 232 of the cables 114 may be soldered to the signal contact pads 408a. For example, the signal conductors 232 at the device end 128 of the second cable section 118 are soldered to the signal contact pads 408a in the row 412. Although not shown in FIG. 6, the signal conductors 232 of the cables 114 in the first cable section 116 (shown in FIG. 3) can be soldered to the signal contact pads 408a in the row 410 in a subsequent assembly step.

Prior to soldering the signal conductors 232, the ends of the cables 114 are prepared by stripping the cables 114. In the illustrated embodiment, the cables 114 are prepared to define an exposed end segment 502 and a jacket-removed segment 504. The cables 114 include dielectric layers (not shown) that surround the signal conductors 232, and also have shield layers 234 surrounding the dielectric layers. The shield layer 234 may be a metal foil, a conductive braid, or both. The cables 114 also have cable jackets 506 that surround the shield layers 234. Optionally, the cables 114 have ground drain wires 508 between the dielectric layer and the cable jacket 506.

The cable jacket 506 has been removed along the jacket-removed segment 504. Thus, the ground drain wire 508 and the one or more shield layers 234 are exposed along the jacket-removed segment 504. To prepare the exposed end segment 502, all layers of the cable 114 are stripped away from the signal conductors 232. The exposed end segment 502 is a cantilevered length of the signal conductors 232 extending from the jacket-removed segment 504 to an end 510 of the cable 114. In the illustrated embodiment, the cables 114 are placed on the top side 222 of the circuit board 220 such that the exposed end segment 502 is received over the signal contact pads 408a on the raised platform 424 of the circuit board 220. The signal conductors 232 along the exposed end segments 502 are then soldered to the corresponding contact pads 408a. The jacket-removed segments 504 of the cables 114 in the second cable section 118 align with and engage the recessed area 428 of the circuit board 220. The height of the step from the recessed area 428 to the platform 424 may be designated based on a size or thickness of the cables 114 in order to eliminate, or at least reduce, bend along the signal conductors 232 from the jacket-removed segments 504 to the contact pads 408a. Although soldering is described as the process for electrically terminating the signal conductors 232 to the contact pads 408a, soldering is a non-limiting example and other processes may be used such as welding or the like.

Figure 7:
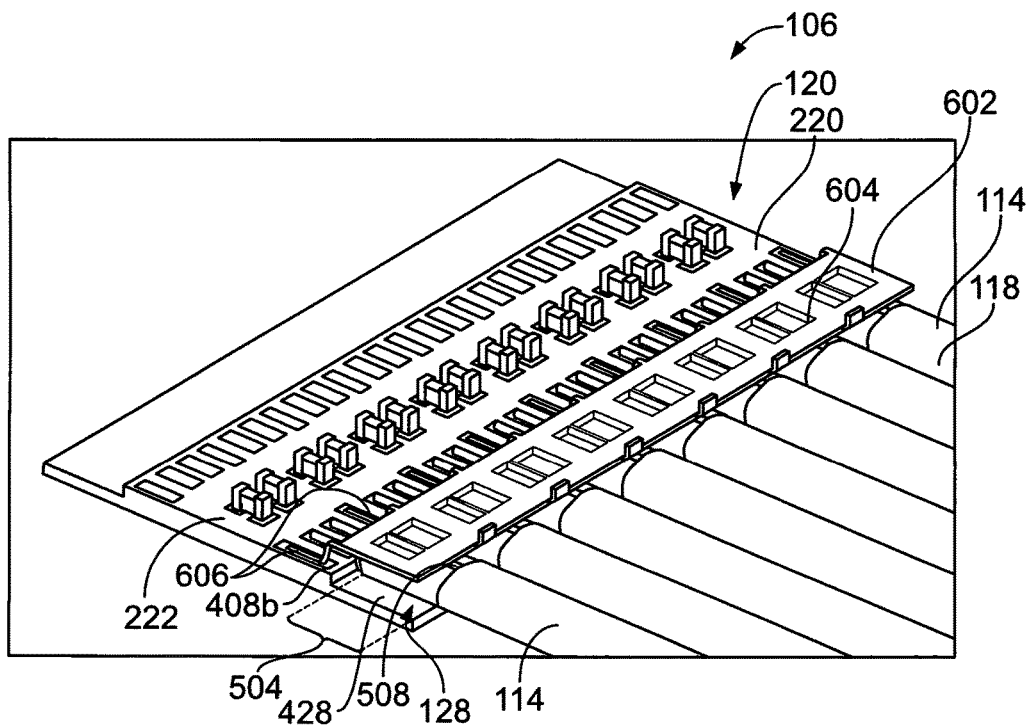
FIG. 7 is a top perspective view of the cable assembly during a subsequent assembly stage showing the substrate of the filtering module, the electrical cables, and a ground bus bar according to an embodiment.

FIG. 7 is a top perspective view of the cable assembly 106 during a subsequent assembly stage showing the circuit board 220 of the filtering module 120, the electrical cables 114 in the second cable section 118, and a ground bus bar 602 according to an embodiment. The ground bus bar 602 extends across the device end 128 of the second cable section 118. More specifically, the ground bus bar 602 extends across the jacket-removed segments 504 of the cables 114 and mechanically engages the ground drain wires 508 and/or the shield layers 234 of the cables 114. The ground bus bar 602 provides a ground plane that electrically commons the ground drain wires 508 of multiple cables 114 in the second cable section 118. In alternative embodiments, the ground bus bar 602 may engage other ground components of the cables 114, such as conductive foils or braids. In the illustrated embodiment, the ground bus bar 602 includes a conductive panel 604 that is elongated to extend across all of the cables 114 in the second cable section 118. The panel 604 extends over the cables 114 and aligns with the recessed area 428. The jacket-removed segments 504 of the cables 114 are sandwiched between the panel 604 and the recessed area 428.

The ground bus bar 602 in an embodiment also includes multiple legs 606 that extend from the panel 604. The legs 606 extend to the top side 222 of the circuit board 220. The legs 606 align with, and are configured to be electrically terminated to, the ground contact pads 408b. For example, the legs 606 may be solder tails that are terminated to the corresponding ground contact pads 408b by soldering, welding, or the like. The ground contact pads 408b of the circuit board 220 may be electrically connected to a grounding circuit (not shown) of the circuit board 220. Therefore, the ground bus bar 602 electrically commons the ground drain wires 508 of the cables 114 in the second cable section 118 to each other, and also to the grounding circuit within the circuit board 220. The termination of the legs 606 mounts the ground bus bar 602 to the circuit board 220. Optionally, an adhesive may be applied between the panel 604 and the cables 114 to secure the panel 604 in engagement with the drain wires 508.

Optionally, the ground bus bar 602 may additionally include tabs 612 that project generally vertically upwards from the panel 604 (e.g., in a direction away from the circuit board 220). The tabs 612 are configured to extend through apertures 614 (shown in FIGS. 2 and 3) of the cover 214 (FIGS. 2 and 3) to electrically connect the ground bus bar 602 to the cover 214 when the cable assembly 106 is assembled. For example, the cover 214 may engage a grounding element outside of the cable assembly, such as a chassis. The ground bus bar 602 and the cover 214 provide a conductive ground path from the grounding circuit of the circuit board 220 and the drain wires 508 of the cables 114 to the chassis.

Referring now back to FIG. 3, after the cables 114 of the second cable section 118 and the ground bus bar 602 are mounted to the circuit board 220 as shown in FIGS. 6 and 7, subsequent assembly steps include performing the same or similar actions to mount the cables 114 of the first cable section 116 (shown in FIG. 3) and another ground bus bar 616 (FIG. 3) to the other side of the circuit board 220. The ground bus bar 616 extends across the device end 124 of the first cable section 116. The ground bus bar 616 may have an identical size and shape to the ground bus bar 602. The ground bus bars 602, 616 mirror each other on either side of the passive filtering devices 140. In an alternative embodiment, instead of having two discrete ground bus bars 602, 616, the ground bus bars 602, 616 may share a common, larger panel to define a single, unitary ground bus bar that extends above the passive filtering devices 140. The ground bus bars 602, 616 are optional, and one or more alternative embodiments of the cable assembly 106 may omit the bus bars 602, 616.

With continued reference to FIG. 3, the following assembly step may be to mount the cover 214 to the circuit board 220. When the cover 214 is loaded onto the circuit board 220 from above, the tabs 612 of the ground bus bars 602 are received into the corresponding apertures 614 of the cover 214. In addition to providing an electrical connection interface, the engagement between the tabs 612 and the edges of the apertures 614 may mechanically secure the cover 214 to the circuit board 220.

Figure 8:
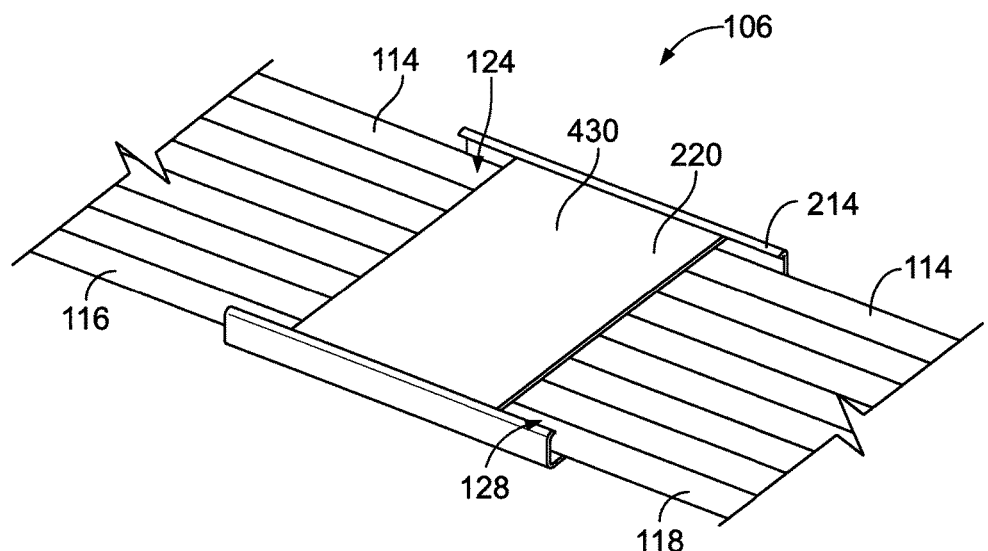
FIG. 8 is a bottom perspective view of the cable assembly during a final assembly stage according to an embodiment.

FIG. 8 is a bottom perspective view of the cable assembly 106 during a final assembly stage according to an embodiment. The cover 214 is mounted to the circuit board 220 and covers the top side 222 (shown in FIG. 3) of the board 220 and the cables 114. The cover 214 does not cover the bottom side 430 of the circuit board 220 or the bottom portions of the cables 114 at the device ends 124, 128 of the first and second cable sections 116, 118. In an embodiment, the dielectric filler material 216 (shown in FIG. 9) is applied onto the bottom side 430 of the circuit board 220. The dielectric filler material 216 is also applied onto the cables 114 at the device ends 124, 128. The dielectric filler material 216 may be a plastic that is heated and flowed in a liquid state during the application, and then allowed to cool to solidify. Alternatively, the dielectric filler material 216 may be a discrete solid body that is coupled to the cover 214. The dielectric filler material 216 fills in spaces or gaps between the cover 214 and the bottom side 430 of the circuit board 220 and between the cover 214 and the cables 114.

Figure 9:
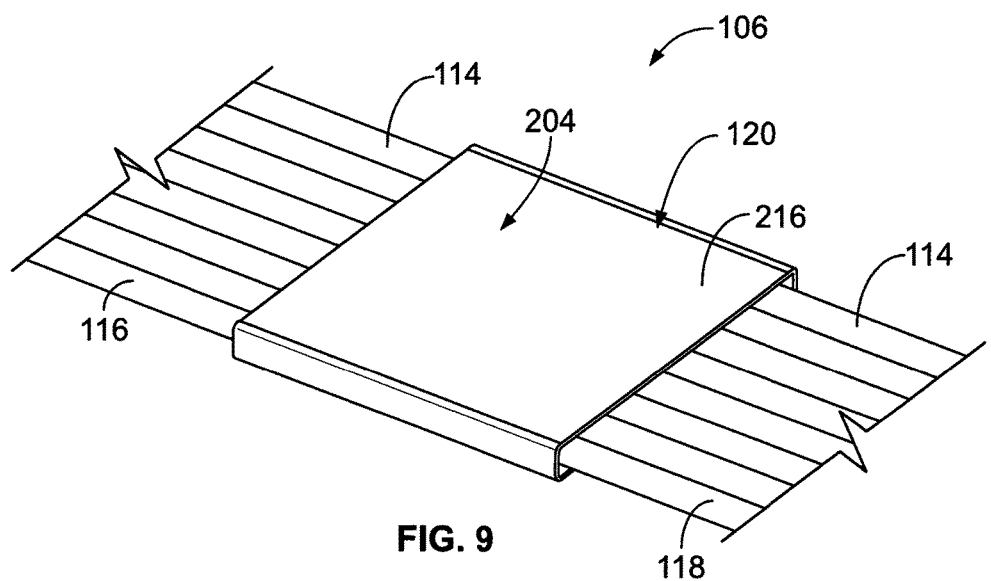
FIG. 9 shows a bottom perspective view of an assembled cable assembly according to an embodiment.

FIG. 9 shows a bottom perspective view of an assembled cable assembly 106 according to an embodiment. The dielectric filler material 216 defines the bottom 204 of the filtering module 120. As described above with reference to FIG. 2, the dielectric filler material 216 may provide a seal to block the entrance of debris and other contaminants, may provide structural support to the cable assembly 106, and may provide strain relief for the cables 114 in the first and second cable sections 116, 118.

Figure 10:
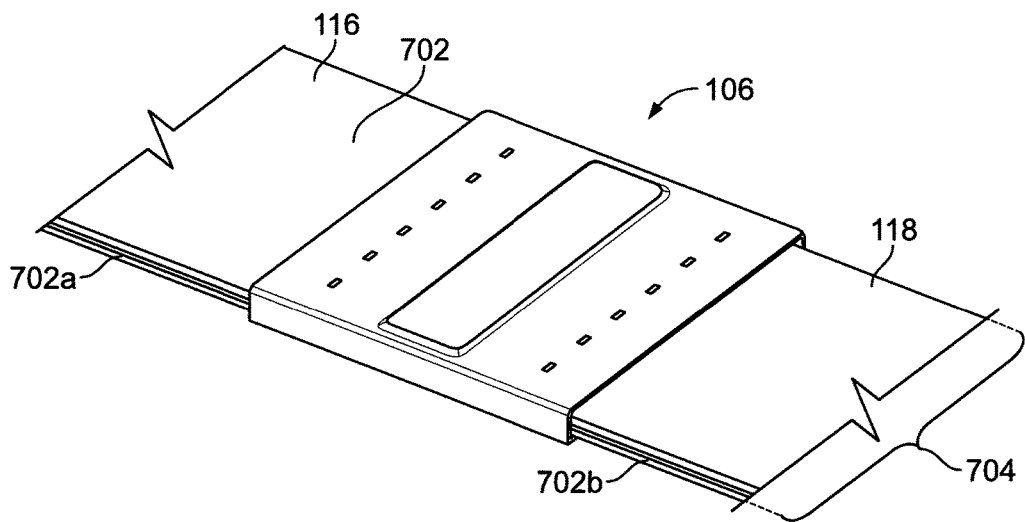
FIG. 10 is a perspective view of a portion of one cable assembly of the connector system according to an alternative embodiment.

FIG. 10 is a perspective view of a portion of one cable assembly 106 of the connector system 100 (shown in FIG. 1) according to an alternative embodiment. The cable assembly 106 in FIG. 10 is similar to the cable assembly 106 in FIG. 2 except that the first cable section 116 and the second cable section 118 of the cable assembly 106 in FIG. 10 include ribbon cables 702 instead of twin-axial cables 114. The ribbon cables 702 are relatively flat and planar. In the illustrated embodiment, a single ribbon cable 702a defines the entire first cable section 116, and a single ribbon cable 702b defines the entire second cable section 118. The ribbon cables 702a, 702b each have at least one pair of signal conductors that resemble the signal conductors 232 shown in FIG. 3. Each of the ribbon cables 702a, 702b may include numerous pairs of signal conductors along the widths 704 of the ribbon cables 702a, 702b. In other embodiments, the first and second cable sections 116, 118 each may include multiple ribbon cables 702.

Although one or more of the embodiments presented herein describe the substrate 220 (shown in FIG. 3) of the filtering module 120 (FIG. 3) as being a circuit board, in an alternative embodiment the substrate 220 may be an overmolded lead frame. For example, the substrate 220 may include a dielectric overmold body or housing that holds conductive metal leads. The conductive metal leads of the lead frame may represent the conductive circuit elements 418 shown in FIG. 5. The conductive metal leads may be configured to be welded or soldered directly to the signal conductors 232 of the cables 114, without requiring the contact pads 408. The passive filtering devices 140 may be mounted to a top side of the overmolded lead frame and electrically connected to the leads.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A cable assembly comprising:
multiple electrical cables arranged in a first cable section and a second cable section, each electrical cable having a pair of signal conductors configured to convey differential signals, each of the first cable section and the second cable section having a connector end and a device end; and
a filtering module including a substrate and multiple passive filtering devices mounted on the substrate, the filtering module disposed between the first cable section and the second cable section along a length of the cable assembly and mechanically connected to the respective device ends of the first and second cable sections, the passive filtering devices electrically connected to the signal conductors of the electrical cables,
wherein the connector ends of the first and second cable sections are configured to be electrically connected to corresponding first and second connectors, and the filtering module is configured to filter electrical signals conveyed along the electrical cables between the first and second connectors.

2. The cable assembly of claim 1, wherein the first cable section includes multiple electrical cables arranged in a row, and the second cable section includes multiple electrical cables arranged in a row.

3. The cable assembly of claim 1, wherein the electrical cables are ribbon cables and the first and second cable sections each include at least one of the ribbon cables.

4. The cable assembly of claim 1, wherein the substrate is a circuit board having a first side, the first side including first and second rows of contact pads, the passive filtering devices mounted to the first side between the first and second rows of the contact pads, the signal conductors of the first cable section being terminated to the contact pads in the first row and the signal conductors of the second cable section being terminated to the contact pads in the second row.

5. The cable assembly of claim 1, wherein a first side of the substrate includes a raised platform located between two recessed areas, the electrical cables including jacket-removed segments and exposed end segments that extend from the jacket-removed segments to respective ends of the electrical cables, the electrical cables including only the signal conductors along the exposed end segments, the signal conductors along the exposed end segments being soldered to contact pads on the raised platform, the jacket-removed segments engaging the recessed areas of the substrate.

6. The cable assembly of claim 1, wherein the filtering module includes two ground bus bars, each ground bus bar extending across the device end of a different one of the first and second cable sections and mechanically engaging one or more of conductive shield layers or ground drain wires of the electrical cables.

7. The cable assembly of claim 6, wherein the ground bus bars each include a panel and multiple legs that extend from the respective panel, the panels of the ground bus bars engaging the electrical cables, the multiple legs being mechanically mounted to and electrically connected to a grounding circuit of the substrate of the filtering module.

8. The cable assembly of claim 1, wherein each passive filtering device is located along a different conductive signal line through the substrate, each conductive signal line extending between and electrically connecting one of the signal conductors of the first cable section to one of the signal conductors of the second cable section.

9. The cable assembly of claim 1, wherein the passive filtering devices of the filtering module are configured to allow electrical signals in a frequency range of interest to be conveyed between the first cable section and the second cable section and filter out frequencies outside of the frequency range of interest.

10. The cable assembly of claim 1, wherein the passive filtering devices are capacitors.

11. The cable assembly of claim 1, wherein the filtering module includes a conductive cover that extends above a first side of the substrate that faces the conductive cover, wherein the passive filtering devices and the device ends of the first and second cable sections are disposed between the first side of the substrate and the conductive cover.

12. The cable assembly of claim 11, wherein the conductive cover defines a top of the filtering module, and the filtering module includes a dielectric filler material that defines a bottom of the filtering module, the dielectric filler material engaging each of the conductive cover, a second side of the substrate that is opposite to the first side, and the electrical cables at the device ends of the first and second cable sections.

13. A connector system comprising:
first and second electrical connectors, each of the first and second electrical connectors having a mating end and a mounting end; and
multiple cable assemblies electrically connected to and extending between the respective mounting ends of the first and second electrical connectors, the cable assemblies arranged in a stack, each of the cable assemblies comprising:
a filtering module including a substrate and multiple passive filtering devices mounted on the substrate;
a first cable section of one or more electrical cables, the first cable section having a connector end coupled to the mounting end of the first electrical connector and a device end coupled to the filtering module; and
a second cable section of one or more electrical cables, the second cable section having a connector end coupled to the mounting end of the second electrical connector and a device end coupled to the filtering module,
wherein the filtering module of each cable assembly is configured to filter electrical signals conveyed along the electrical cables of the first and second cable sections between the first and second connectors.

14. The connector system of claim 13, wherein each of the electrical cables in the first and second cable sections has a pair of signal conductors configured to convey differential signals, the passive filtering devices of the filtering module are arranged in pairs in-line with corresponding pairs of the signal conductors.

15. The connector system of claim 13, wherein the one or more electrical cables of the first cable section and the second cable section in each cable assembly are arranged along a row, and the multiple cable assemblies are stacked adjacent to one another along a stack axis that is perpendicular to the rows of electrical cables in the individual cable assemblies.

16. The connector system of claim 13, wherein the passive filtering devices of the filtering module in each cable assembly are configured to allow electrical signals in a frequency range of interest to be conveyed between the first cable section and the second cable section and filter out frequencies outside of the frequency range of interest.

17. The connector system of claim 13, wherein the substrate of the filtering module in each cable assembly is a circuit board having a first side, the first side including first and second rows of contact pads, the passive filtering devices mounted to the first side between the first and second rows of the contact pads, the signal conductors of the first cable section being terminated to the contact pads in the first row and the signal conductors of the second cable section being terminated to the contact pads in the second row.

18. A cable assembly comprising:
 a first electrical cable and a second electrical cable that each has multiple signal conductors; and
 a filtering module disposed between the first electrical cable and the second electrical cable, the filtering module including a circuit board and multiple passive filtering devices, at least some of the passive filtering devices terminated to device contact pads on a first side of the circuit board, the circuit board extending between a first cable end and a second cable end that is opposite to the first cable end, the circuit board including a first array of signal contact pads located between the passive filtering devices and the first cable end along the first side, the circuit board including a second array of signal contact pads located between the passive filtering devices and the second cable end along the first side, the circuit board including conductive circuit elements that provide conductive signal paths between the signal contact pads and the device contact pads to which the passive filtering devices are terminated,
 wherein the signal conductors of the first electrical cable are terminated to the signal contact pads in the first array, and the signal conductors of the second electrical cable are terminated to the signal contact pads in the second array, and
 wherein the passive filtering devices of the filtering module are configured to filter electrical signals conveyed along the signal conductors of the first and second electrical cables.

19. The cable assembly of claim 18, wherein the first side of the circuit board includes a raised platform located between two recessed areas, the first and second arrays of the signal contact pads disposed on the raised platform, the first and second electrical cables including jacket-removed segments and exposed end segments that extend from the jacket-removed segments to respective ends of the first and second electrical cables, the jacket-removed segments engaging the recessed areas of the circuit board.

20. The cable assembly of claim 18, wherein the first and second electrical cables are twin-axial cables, each of the twin-axial cables including a pair of the signal conductors configured to convey differential signals.

* * * * *